(12) United States Patent
Hirano

(10) Patent No.: US 7,167,034 B2
(45) Date of Patent: Jan. 23, 2007

(54) ARRANGEMENT FOR CORRECTING THE PHASE OF A DATA SAMPLING CLOCK SIGNAL DURING A PERIOD OF SAMPLING DATA IN A RECEIVED SIGNAL

(75) Inventor: Takaaki Hirano, Tokyo (JP)

(73) Assignee: Oki Electric Industry Co., Ltd., Osaka (JP)

( * ) Notice: Subject to any disclaimer, the term of this patent is extended or adjusted under 35 U.S.C. 154(b) by 22 days.

(21) Appl. No.: 11/038,061

(22) Filed: Jan. 21, 2005

(65) Prior Publication Data

US 2005/0156645 A1    Jul. 21, 2005

(30) Foreign Application Priority Data

Jan. 20, 2004    (JP)    ............................... 2004-011477

(51) Int. Cl.
*H03H 3/00*    (2006.01)
(52) U.S. Cl. ...................... 327/233; 327/231; 327/237
(58) Field of Classification Search ........ 327/233–237, 327/165, 231, 241
See application file for complete search history.

(56) References Cited

U.S. PATENT DOCUMENTS 5,787,132 A * 7/1998 Kishigami et al. .......... 375/354
5,920,220 A * 7/1999 Takao et al. ................ 327/233
6,280,774 B1 * 8/2001 Rang .......................... 424/528
6,618,459 B1    9/2003 Tada

* cited by examiner

Primary Examiner—Dinh T. Le
(74) Attorney, Agent, or Firm—Nixon Peabody LLP; Donald R. Studebaker

(57)    ABSTRACT

In a clock phase corrector appropriately correcting the phase of a data sampling clock signal, a series of shift registers responds to respective sampling clock signals to store received data sequentially. The stored data are duplicated by a comparator register in response to corresponding clock signals to output a demodulated signal. A corrector shift register is provided to store sampled data in response to a clock signal. The data thus stored are then held in a reception register as intended reception data. A comparator compares the demodulated signal with the intended reception data. Based upon a result from the comparison, a bit adder produces the number of inconsistent bits. Another comparator compares the number of inconsistent bits with the number of error acceptance bits stored in an error acceptance memory to generate a phase detection signal, in response to which a timing control adjusts the phase of a data sampling clock signal.

10 Claims, 9 Drawing Sheets

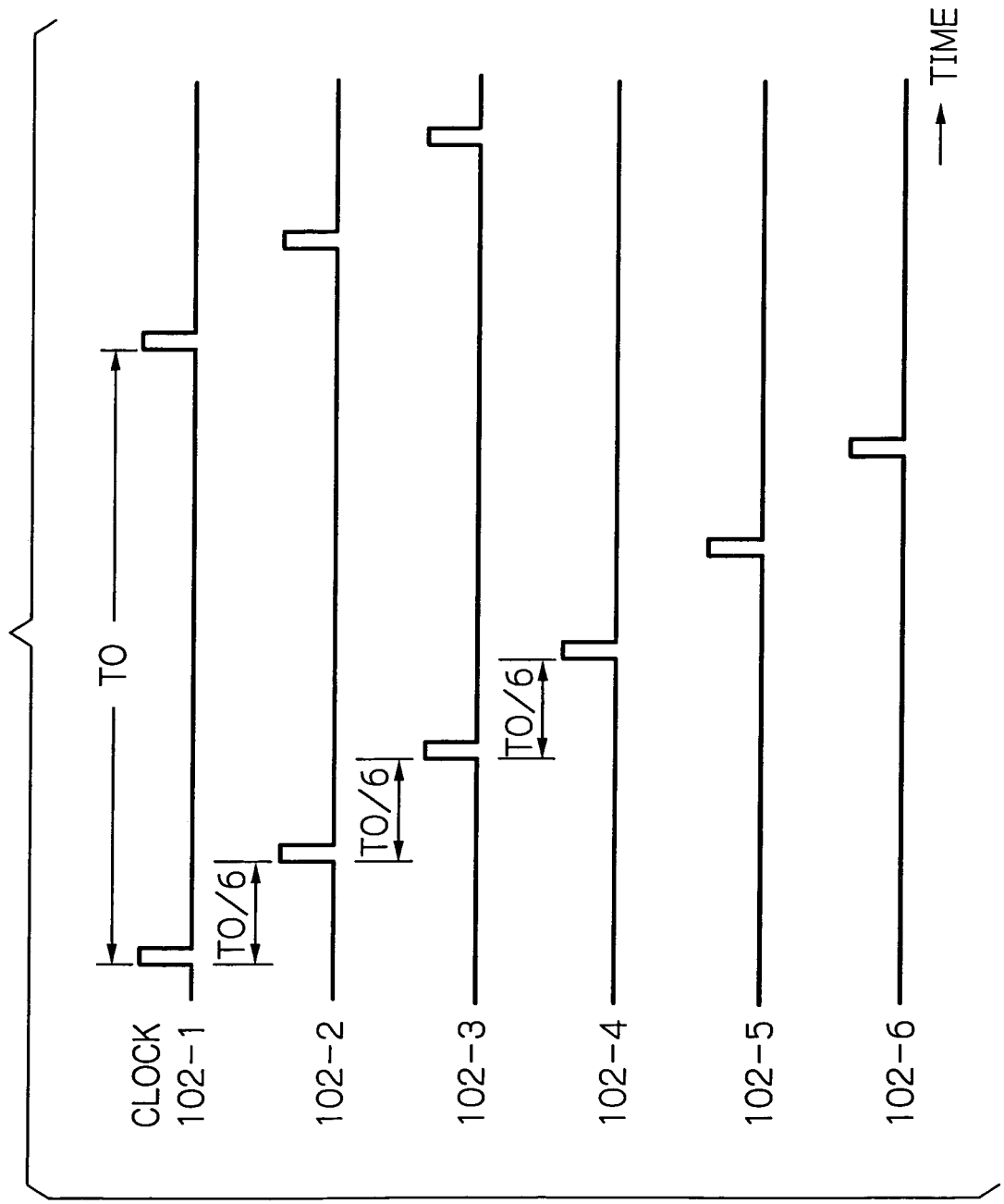

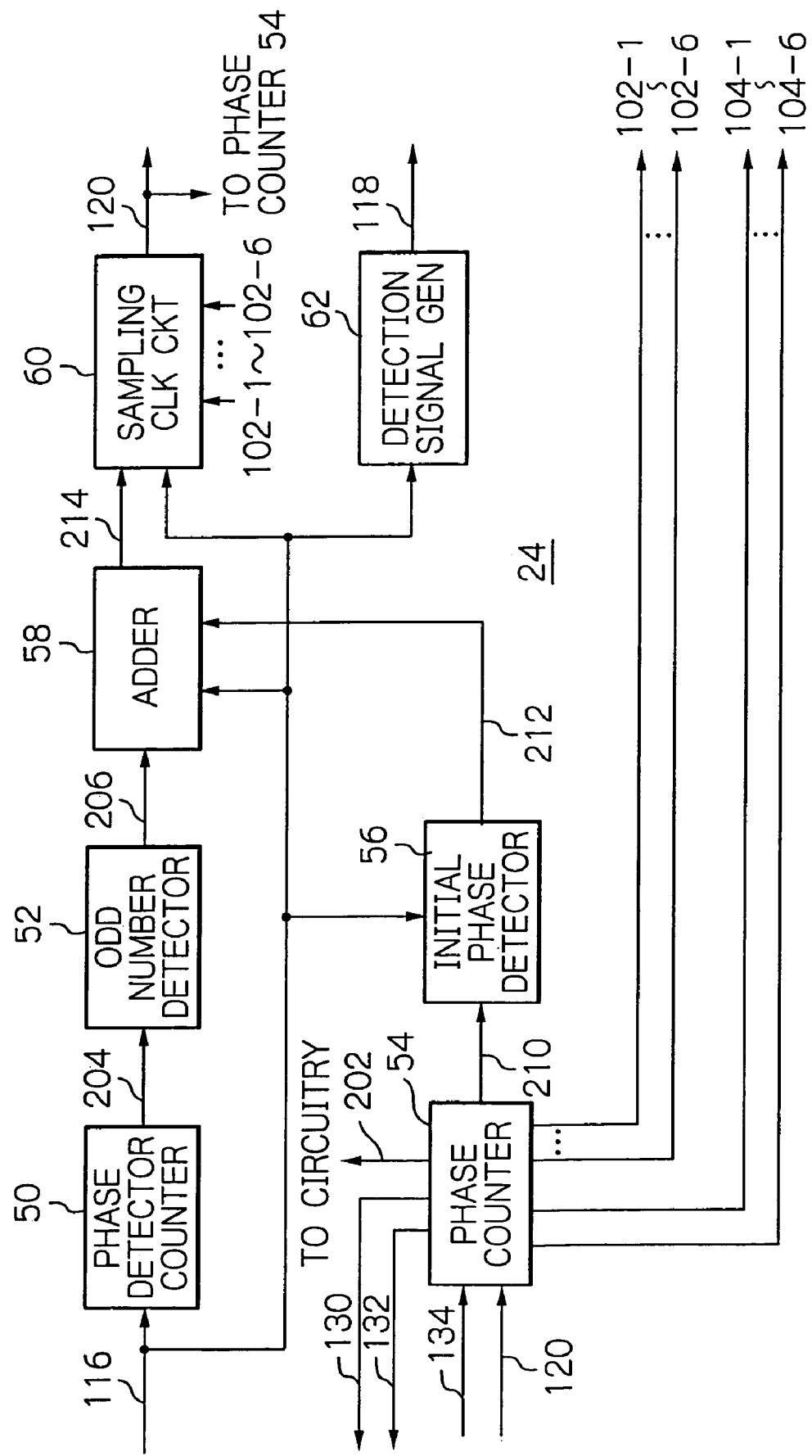

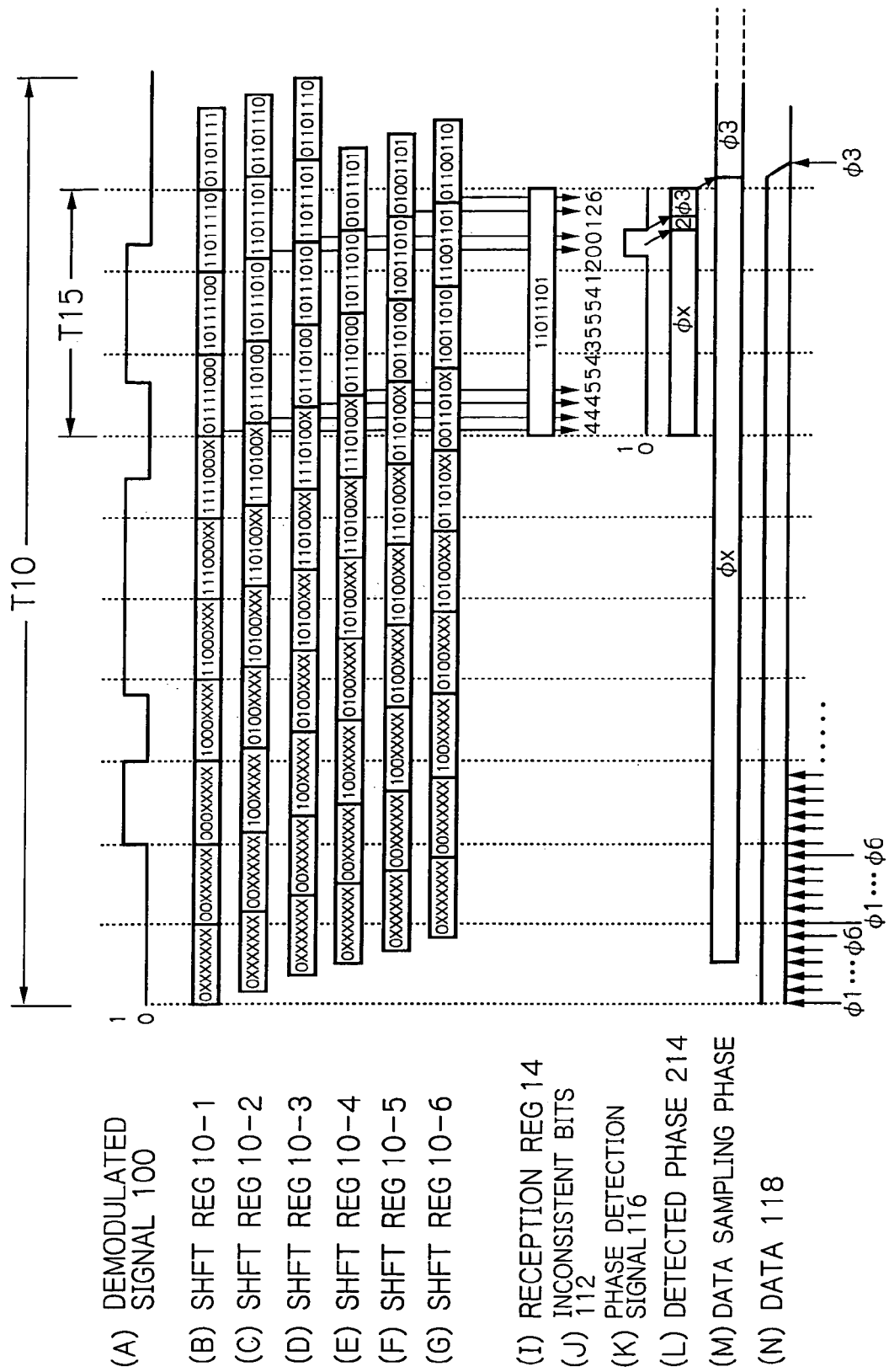

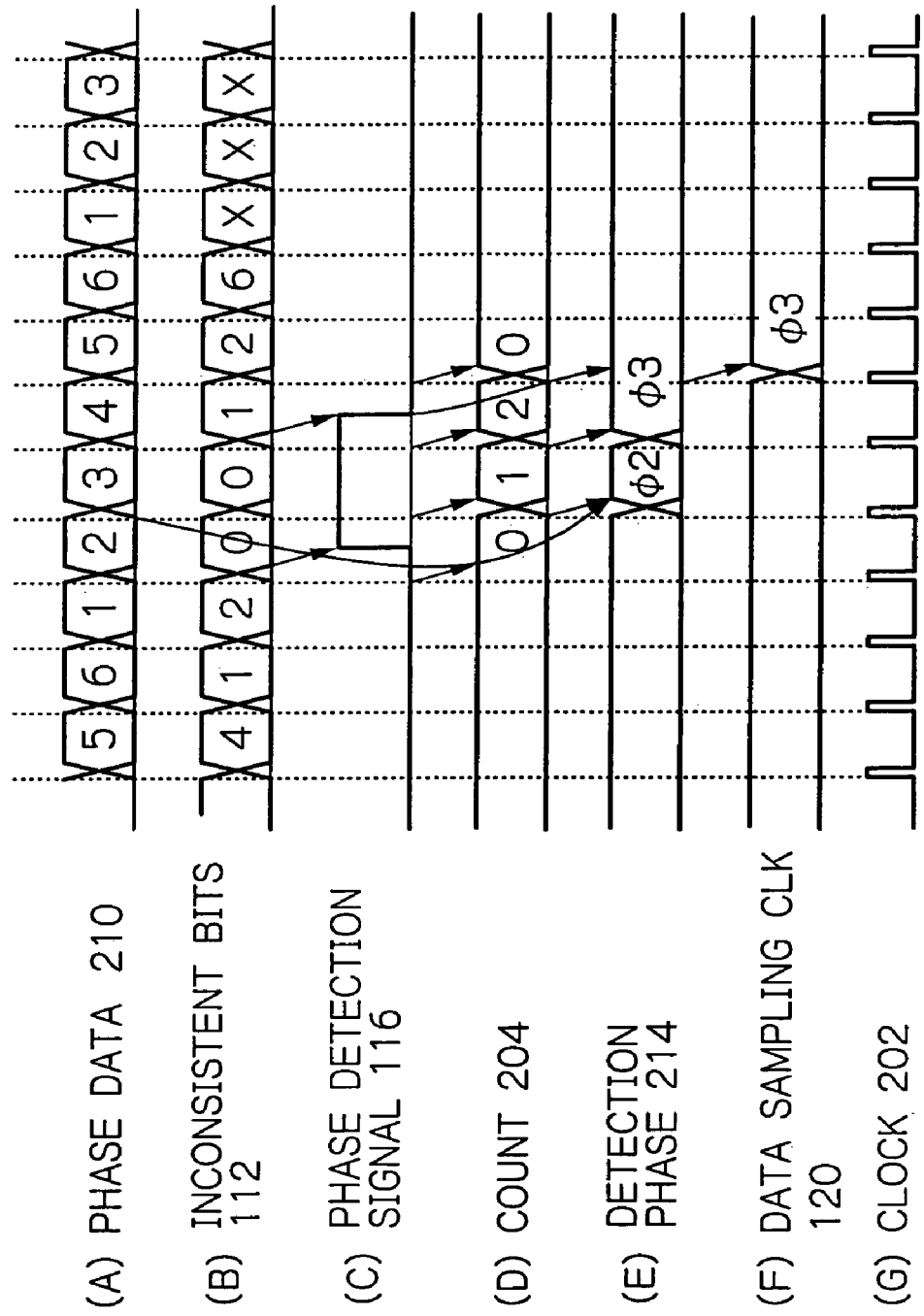

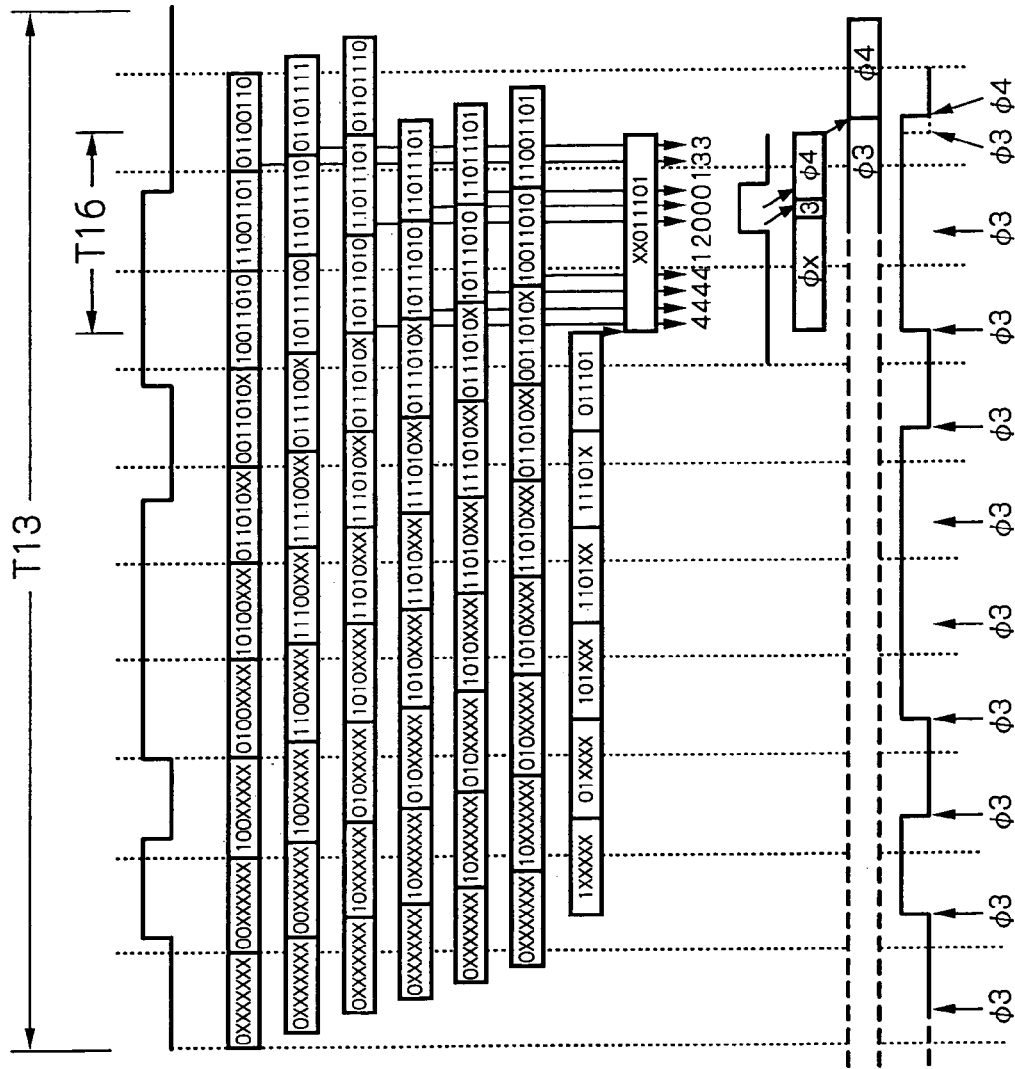

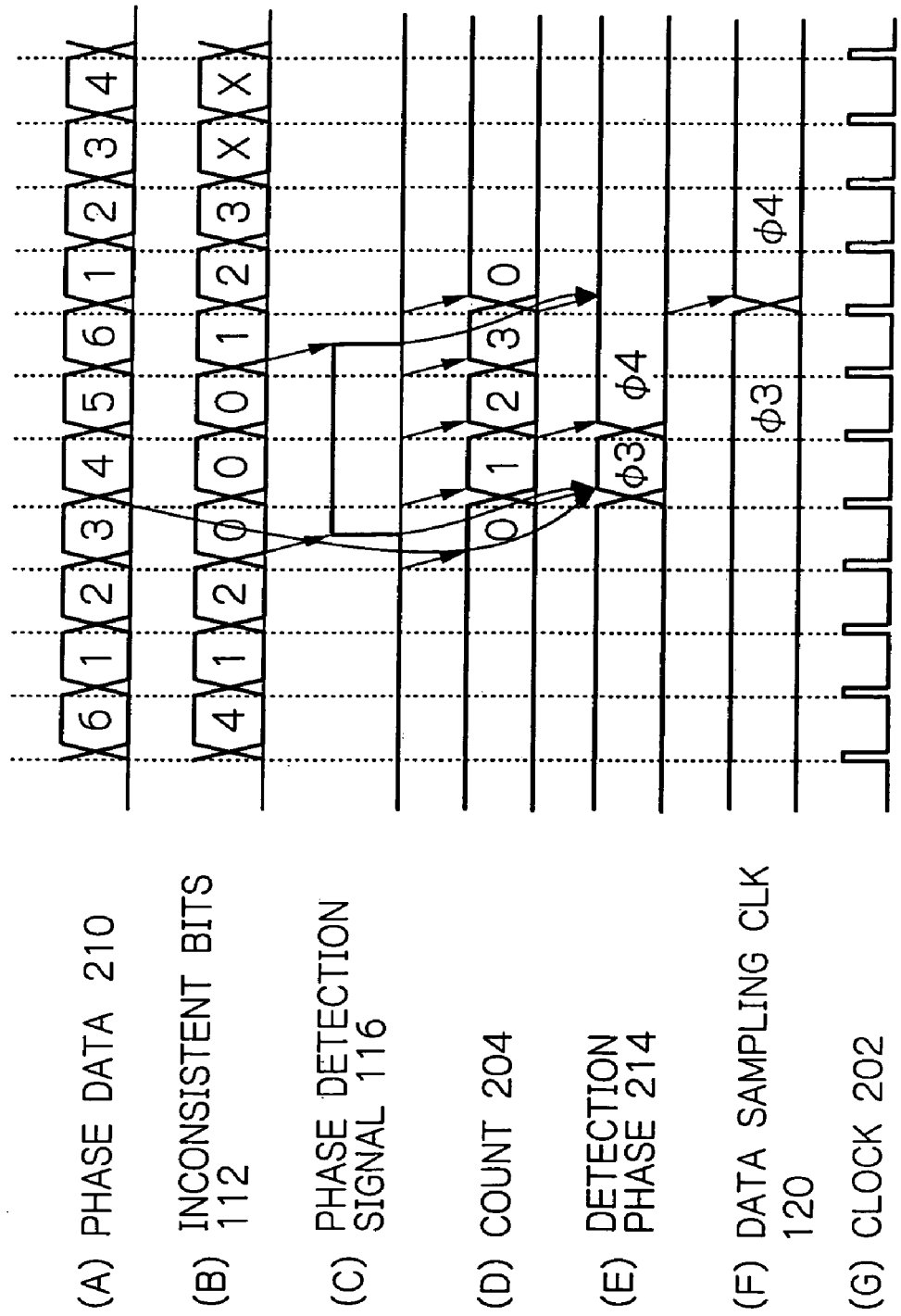

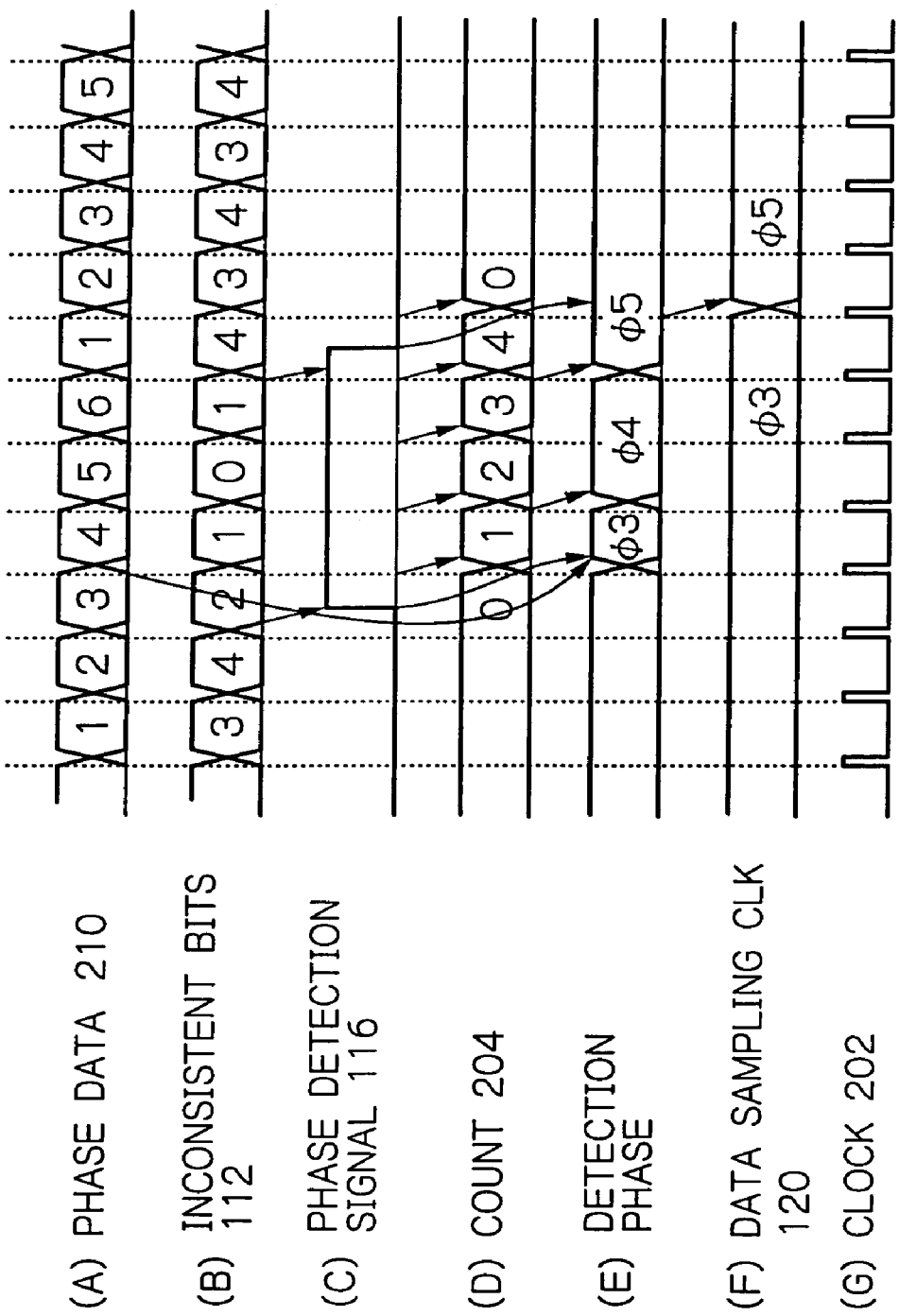

ARRANGEMENT FOR CORRECTING THE PHASE OF A DATA SAMPLING CLOCK SIGNAL DURING A PERIOD OF SAMPLING DATA IN A RECEIVED SIGNAL

BACKGROUND OF THE INVENTION

1. Field of the Invention

The present invention relates to a clock phase corrector, and more specifically to a circuit for correcting the phase of a data sampling clock signal for use in sampling data included in a received packet carried by a demodulated signal.

2. Description of the Background Art

In radio communication systems, a receiver device is generally adapted to determine, on the basis of a synchronous signal or an inter-device identification included in the top field of a packet received, whether or not to take in, or sample, signals of the packet received. For example, some radio communications device has a radio receiver for receiving and demodulating a packet transmitted and over-sampling the top field of the packet with a clock signal having its rate several times as high as the data transfer rate. With such a radio communications device, data resultant from the over-sampling are compared with its inter-device identification to thereby detect the inter-device identification carried by the received packet. Further, on the basis of the timing at which the inter-device identification was detected, the radio communications device determines the phase of a data sampling clock signal for use in taking in, or sampling, data included in the received packet, and subsequently uses that data sampling clock signal having the phase thus determined to sample the data included in the received packet.

In the prior art, U.S. Pat. No. 6,618,459 to Tada issued on Sep. 9, 2003, discloses a radio communications device adapted, not to fix the phase of a clock signal for use in sampling received data, but to determine a difference in phase of a clock signal for sampling received data carried by a demodulated signal at each logical transition point of the data to adjust the phase of the clock signal adaptively to the difference thus determined.

However, the reference signals in a radio communications system involve a deviation and a fluctuation in frequency caused by its ambient temperature or aging to raise a difference in frequency of the reference signals between a transmitter and a receiver station. Even when a clock signal for sampling data is appropriately adjusted during the detection of an inter-device identification of a received signal, for example, the clock signal becomes gradually shifted in phase from the signals being received, as the time elapses, to the extent that data contained in a received packet near its end fail to be appropriately sampled, thus causing a possibility of losing the data. That was a difficulty in the prior art.

It could be possible to overcome that difficulty by utilizing a much higher frequency for over-sampling inter-device identification signals so as to define the timing for detecting inter-device identifications with extensive accuracy, thereby adjusting the phase of a clock signal for sampling received data to its most appropriate phase with higher accuracy. The increasing of the frequency of an over-sampling clock signal would result in an increased power consumption as well as a bar to miniaturization of the associated circuitry.

With the radio communications device disclosed in the U.S. patent to Tada stated above, the phase difference of a clock signal for sampling received data carried by a demodulated signal is determined at each of the transitions of the data values, and the phase of the clock signal is adaptively adjusted to the phase difference thus determined. That may indeed prevent a failure in sampling the received data due to deviation in phase. In order to correct the phase of a clock signal for sampling received data, however, circuitry is required for correcting the phase of the clock signal. Such phase corrector circuitry generally tends to be complicated in structure.

SUMMARY OF THE INVENTION

It is an object of the present invention to provide a clock phase corrector for appropriately correcting the phase of a clock signal for sampling data so as to avoid a failure to sample the data.

In accordance with the present invention, a clock phase corrector for correcting a phase of a data sampling clock signal comprises: a timing control circuit for generating a plurality of sampling clock signals, and selecting one of the sampling clock signals as the data sampling clock signal, the plurality of sampling clock signals having a same period as a regenerated clock signal recovered from a demodulated signal and a phase different from each other; an over-sampling circuit operative in response to the plurality of sampling clock signals for sampling the demodulated signal, the over-sampling circuit comprising a plurality of shift registers, each of which corresponds to one of the plurality of sampling clock signals and stores a signal sampled in response to corresponding one sampling clock signal; a gate circuit operative in response to the data sampling clock signal for sampling the demodulated signal to output data resultant from sampling; a storage circuit for storing the data output from the gate circuit as intended reception data; a calculator for comparing the intended reception data with the sampled signals respectively stored in the plurality of shift registers to determine a number of inconsistent bits between the intended reception data and the sampled signals; and a comparator for comparing the number of inconsistent bits with a predetermined error acceptance number, and determining a period of time in which the number of inconsistent bits is smaller than the predetermined error acceptance number, the timing control circuit determining a center of the period of time and selecting one of the plurality of sampling clock signals which corresponds to the center as the data sampling clock signal.

In an aspect of the invention, the timing control circuit of the clock phase corrector may provide the plurality of shift registers correspondingly with the plurality of sampling clock signals to cause the storage circuit to be fed with the sampled signal stored in one of the plurality of shift registers which is supplied with the one sampling clock signal selected.

More specifically, in a clock phase corrector appropriately correcting the phase of a data sampling clock signal, a series of shift registers responds to respective sampling clock signals to store received data sequentially. The stored data are duplicated by a comparator register in response to corresponding clock signals to output a demodulated signal. A corrector shift register is provided to store sampled data in response to a clock signal. The data thus stored are then held in a reception register as intended reception data. A comparator compares the demodulated signal with the intended reception data. Based upon a result from the comparison, a bit adder produces the number of inconsistent bits between the demodulated signal and the intended reception data. Another comparator compares the number of inconsistent bits with the number of error acceptance bits stored in an error acceptance memory to generate a phase detection signal, in response to which a timing control circuit adjusts the phase of a data sampling clock signal.

In accordance with the invention, the phase of a data sampling clock signal is adjusted in a period of time in which data carried by a demodulated signal is sampled to avoid a failure to appropriately sample the data. It is therefore not necessary to detect an inter-device identification with higher resolution on a time axis as in the prior art to determine the phase of a data sampling clock signal with minute steps. The invention may therefore reduce the operative frequency of the over-sampling for detecting an inter-device identification, thus reducing the size of circuits as well as the operative frequency and electric power consumption of the circuits.

The clock phase corrector structured as stated above may also minimize the effect of changes in duty width of received data caused by a drift in frequency of a reference oscillator in the radio communications system, thus taking in data from a demodulated signal with accuracy to thereby improve the receiver performance of the system.

In accordance with the present invention, the clock phase corrector may advantageously be applicable to radio communications systems using synchronization detection or inter-device identification signals. The Bluetooth (trademark) transmission system, for example, employs 64 bits of synchronous word as an inter-device identification, and therefore circuitry for detecting the synchronous word may be utilized for an appropriate part of the clock phase corrector in accordance with the invention.

BRIEF DESCRIPTION OF THE DRAWINGS

The objects and features of the present invention will become more apparent from consideration of the following detailed description taken in conjunction with the accompanying drawings in which:

FIG. 3 schematically shows waveforms of clock signals supplied to the shift registers included in the clock phase corrector shown in FIG. 1;

FIG. 4 is a schematic block diagram showing an embodiment of a timing control included in the clock phase corrector shown in FIG. 1;

FIG. 5 is a time chart useful for understanding the operation of the clock phase corrector shown in FIG. 1 in the period of over-sampling an inter-device identification;

FIG. 6 is a time chart useful for understanding the operation of the timing control shown in FIG. 4 in the period of over-sampling an inter-device identification;

FIG. 7 is a time chart, like FIG. 5, useful for understanding the operation of the clock phase corrector shown in FIG. 1 in the period of over-sampling data received;

FIG. 8 is a time chart, like FIG. 6, useful for understanding the operation of the timing control shown in FIG. 4 in the period of over-sampling data received; and FIG. 9 is a time chart, like FIG. 8, useful for understanding an alternative operation of the timing control shown in FIG. 4 in the period of over-sampling data received.

DESCRIPTION OF THE PREFERRED EMBODIMENT

Figure 1:
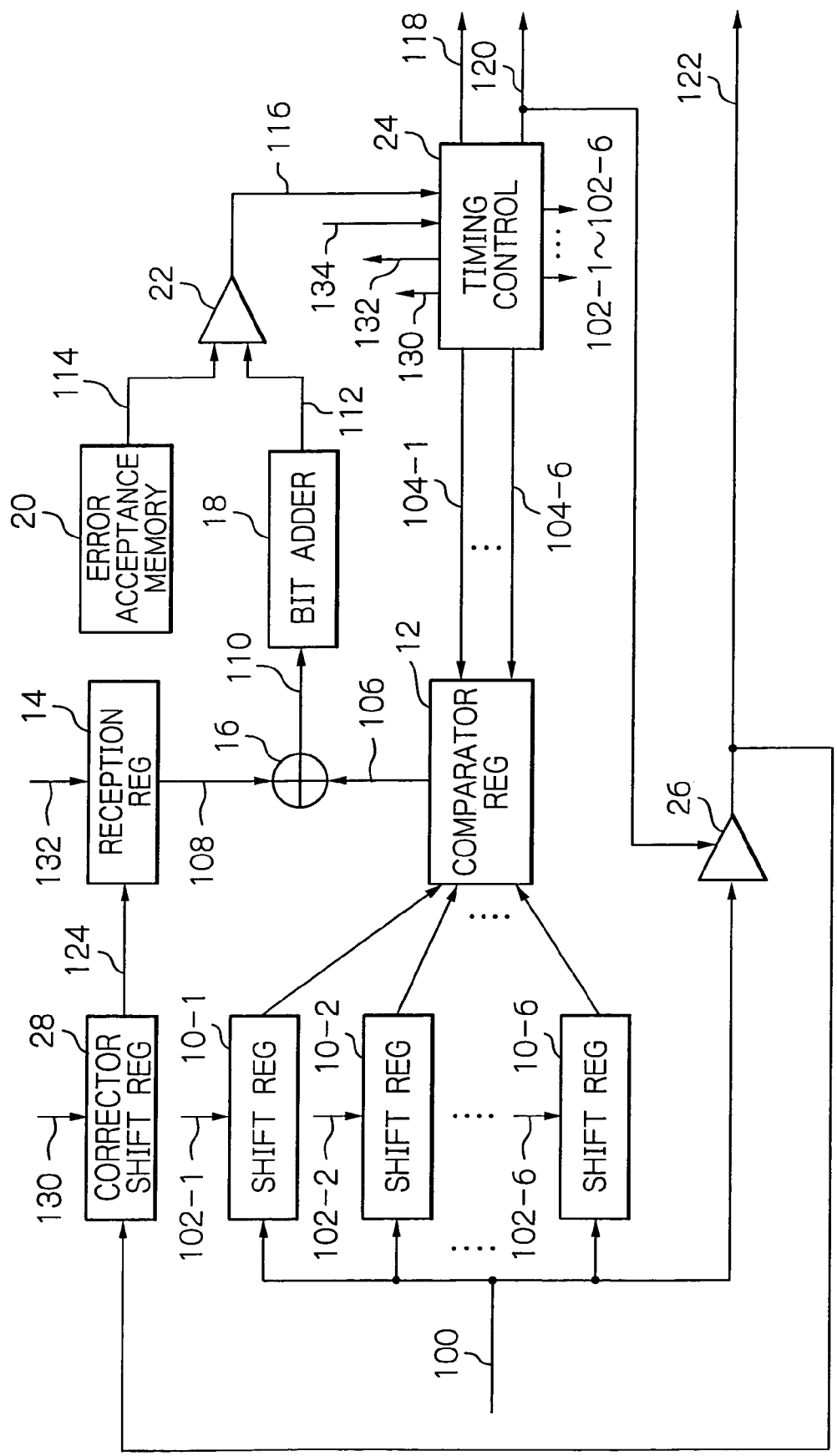
FIG. 1 is a schematic block diagram showing a preferred embodiment of a clock phase corrector in accordance with the present invention.
Figure 2:
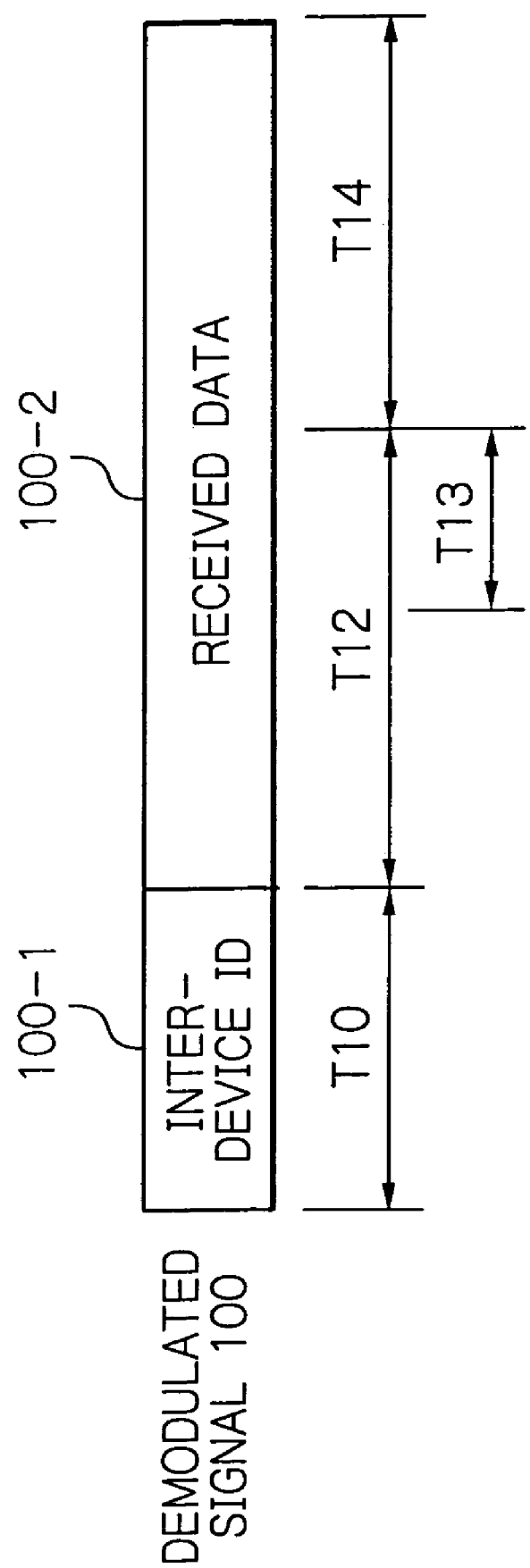
FIG. 2 schematically shows an exemplified format of a received packet.

With reference to FIG. 2 first, a preferred embodiment of a clock phase corrector for correcting or adjusting the phase of a clock signal for taking in, or sampling, received data is adapted to be fed with a received packet 100 carried by a demodulated signal, and to over-sample the demodulated signal 100 during the period of time T10 in which an inter-device identification (ID) signal 100-1 is input to detect the inter-device identification on the basis of the result from the over-sampling. The illustrative clock phase corrector is further adapted to determine the phase of a clock signal 120, FIG. 1, for taking in, or sampling, data received according to the time at which the inter-device identification was detected, and to take in, during the preceding half section T12 of the period of time in which the received data 100-2 are input, data 122, FIG. 1, from the received data 100-2 in response to the data sampling clock signal 120 which has been adjusted in phase in dependent upon the phase thus determined.

In addition, the clock phase corrector of the illustrative embodiment is further adapted to over-sample the received data 100-2 during the on-the-way section T13 of the period in which the received data 100-2 are input to adjust the phase of the data sampling clock signal 120 according to the result from the over-sampling, in case the clock signal 120 for taking in the received data 100-2 is gradually shifted in phase during the trailing section T14 of the period in which the received data 100-2 are sampled to the extent that the data are possibly erroneously sampled near the end of the period of time T14 to cause a failure to correctly take in the data. During the period of time T14 successive to the period T13, the received data 100-2 are sampled in response to the clock signal 120 thus adjusted in phase to extract the data 122 therefrom.

Now, with reference to FIG. 1, the illustrative embodiment of the clock phase corrector includes a set of shift registers 10-1 through 10-6, a comparator register 12, a reception register 14, comparators 16 and 22, a bit adder 18, an error acceptance memory 20, a timing control 24, a gate circuit 26 and a corrector shift register 28, which are interconnected as illustrated. The elements from the shift registers 10-1 through 10-6 to the gate circuit 26 function as a detector for detecting an inter-device identification signal, which is known in the art by themselves. The illustrative embodiment includes the corrector shift register 28 in addition to the known detector for detecting an inter-device identification signal. In the specification, signals are designated with reference numerals indicating connections on which they are conveyed.

The timing control 24 is adapted for generating sampling clock signals 102-1 through 102-6, and supplying the shift registers 10-1 through 10-6 with the respective signals. Each of the sampling clock signals 102-1 through 102-6 has its period T0 substantially equal to that of a clock signal 134 corresponding to the transmission rate of demodulated signal 100, and its phase shifted with respect to preceding one by the period of time T0/6, as seen from FIG. 3. Assuming that the sampling clock signals 102-1 through 102-6 form a single genus clock signal, the genus clock signal appears to have its frequency six times as high as each of the sampling clock signals 102-1 through 102-6.

The shift registers 10-1 through 10-6 are adapted for responding to the sampling clock signals 102-1 through 102-6 thus generated, respectively, to sample and hold the demodulated signal 100 and to shift the data extracted by the sampling toward its output end. The shift registers 10-1 through 10-6 form over-sampling circuitry for over-sampling the demodulated signal 100 in the time periods T10 and T13, FIG. 2, at the frequency six times as high as that of the sampling clock signals 102-1 through 102-6. In a general radio communications system, the inter-device identification signal is often comprised of sixteen or more bits. With the illustrative embodiment, however, the shift registers are adapted, for mere simplicity, for storing eight bits of the inter-device identification signal. The shift registers 10-1 through 10-6 may be formed by flip-flops or storage devices. The inter-device identification signal may include a synchronous pattern signal.

The shift registers 10-1 through 10-6 have output ports thereof interconnected to the comparator register 12 as illustrated. The comparator register 12 is adapted to be responsive to clock signals 104-1 through 104-6 fed from the timing control 24 to duplicate thereinto eight bits of the signal stored in any of the shift registers 10-1 through 10-6 to output a demodulated signal 106 representative of the duplicated signal. More specifically, the timing control 24 generates the clock signals 104-1 through 104-6 in synchronous with the clock signals 102-1 through 102-6, respectively. The comparator register 12 is responsive to any of the shift registers, e.g. 10-1, which has received the demodulated signal 100, and duplicates the signal stored in the corresponding shift register 10-1 to output the duplicated signal on its output 106.

The output 106 from the comparator register 12 is interconnected to one input port of one comparator 16, which has its other input port 108 interconnected to the reception register 14. The reception register 14 is adapted for responding to a control signal 132 fed from the timing control 24 to hold intended reception data. Specifically, as the intended reception data, the reception register 14 stores an inter-device identification in the period T10, FIG. 2, and received data 124 supplied from the corrector shift register 28 in the period T13. The one comparator 16 is configured to compare the demodulated signal 106 provided from the comparator register 12 with the intended reception data 108 held in the reception register 14 on a bit-by-bit basis, whenever it receives the demodulated signal 106, to develop a result from the comparison on its output port 110.

The comparator 16 has its output 110 interconnected to the bit adder 18, which is adapted to respond to the comparison result signal 110 to count the events of inconsistence of the bits between the demodulated signal 106 and the intended reception data 108 to output the signal, or count, 112 representative of the number of the bits inconsistent. For example, the bit adder 18 may be structured to receive the signal 110 representing the result from the inconsistence occurring to accumulate the signal, or to increment, each time it receives the signal 110, to obtain the number of the inconsistent bits with which the inconsistence has occurred associatedly. The comparator 16 and the bit adder 18 serve as an inconsistent bit calculator for obtaining the number of the inconsistent bits between the demodulated signal 106 and the intended reception data 108.

The error acceptance memory 20 is adapted for storing therein in advance data representing the maximum number of erroneous bits which is acceptable during the reception of signals and regulated by a communications standard appropriate for the system. The error acceptance memory 20 has its output port 114 interconnected to one input of the other comparator 22, which has its other input port interconnected to the output 112 from the bit adder 18. The comparator 22 is adapted for comparing the signal 112 representative of the count of inconsistent bits with the number of erroneous bits acceptable and developed on the output 114 from the error acceptance memory 20 to output a phase detection signal on its output port 116. The phase detection signal 116 takes a binary value, which is binary "1" when the inconsistent bit or bits are not more than the error acceptance bit or bits 114, or binary "0" when the former exceeds the latter.

The output port 116 from the comparator 22 is interconnected to the timing control 24. The timing control 24 is a timing generator circuit for producing clock and control signals required for controlling the constituent elements of the entire system. For example, the timing control 24 generates the sampling clock signals 102-1 through 102-6 to be fed to the shift registers 102-1 through 102-6, respectively, and the control signals 104-1 through 104-6 to the comparator register 12. The timing control 24 also generates the clock signal 130 to be fed to the corrector shift register 28, and the timing signal 132 to the reception register 14. The timing control 24 is further adapted to produce a clock signal 202, FIG. 4, to provide it to the circuits included in the timing control 24. The timing control 24 also produces an inter-device identification detection signal 118 to provide it to an external utility circuit, not shown, as well as the data sampling clock signal 120 to provide the latter to the gate circuit 26 and the external utility circuit.

Referring now to FIG. 4, showing a specific embodiment of the timing control 24, the timing control 24 includes a phase detector counter 50, an odd number detector 52, a phase counter 54, an initial phase detector 56, an adder 58, a data sampling clock circuit 60 and a detection signal generator 62, which are interconnected as shown. The phase detector counter 50, the initial phase detector 56, the adder 58, the data sampling clock circuit 60 and the detection signal generator 62 are connected to receive the phase detection signal 116 supplied from the comparator 22, FIG. 1. The phase counter 54 is connected to receive the clock signal 134.

The phase detector counter 50 is adapted for setting its count to a specific value, "0" with the illustrative embodiment, upon receiving the binary value "0" of the phase detection signal 116, and incrementing in response to the clock signal 202 while being primed with the binary value "1" of the phase detection signal 116 provided to output a count on its output port 204. The output port 204 is interconnected to the input of the odd number detector 52. The odd number detector 52 is adapted to determine whether or not the count 204 received is an odd number, and produce a significant pulse on its output port 206 when detecting the count 204 as an odd number. More specifically, the count 204 is in the form of binary value, and therefore determined as an odd number when the least significant bit of the count 204 takes a binary value "1".

The phase counter 54 serves as generating clock and control signals. Specifically, the phase counter 54 is responsive to, and synchronous with, the clock signal 134 provided from an external circuit, not shown, to produce the clock signal 202, which has its frequency n times as high as the regenerated clock signal 134, where n is a positive number, e.g. "6" with the illustrative embodiment. The circuit elements included in the timing control 24 are connected to receive the clock signal 202 to be operative in response. The phase counter 54 is also adapted to be responsive to the clock signal 202 by itself to produce, during the time periods T10 and T13, FIG. 2, phase data 210 representative of phases Φ1 through Φ6, which define the phases of the sampling clock signals 102-1 through 102-6 and the clock signals 104-1 through 104-6, respectively, and, during the time period T13, the clock signal 130 synchronous with the data sampling clock signal 120 also. The phase counter 54 also produces the control signal 132, in response to which the inter-device identification and received data 124 will be held.

The commencing timing of the period of time T13 is set so as to successfully sample the received data 100-2 without losing the data. If the timing is expected at which received data are possibly lost, the commencing timing of the time period T13 may then be set in advance accordingly to the expected timing. In the periods T12 and T14 during which the received data 100-2 are sampled, a single, or a plurality of, time periods corresponding to the time period T13 may be set. Alternatively, the system may be adapted to determine the phase difference of the regenerated clock signal 134 from the data sampling clock signal 120 during the time period for sampling the received data 100-2, and to detect when the phase difference exceeds a predetermined threshold to set the beginning point of the time period T13 accordingly to the timing thus detected.

The phase counter 54 has its output 210 interconnected to the initial phase detector 56. The initial phase detector 56 is operative in response to the positive-going transition of the binary phase detection signal 116 to take in the phase data 210 from the phase counter 54, and output the phase data on its output port to the adder 60 in the form of initial phase signal 212.

The adder 58 has its input ports interconnected to the outputs 206 and 212 from the odd number detector 52 and the initial phase detector 56, respectively. The adder 58 has a counter, not specifically shown, which is adapted for setting itself with the initial phase signal 212 as its initial count. The counter increments, while being primed with the binary value "1" of the phase detection signal 116, by a value corresponding to the phase value T0/6 in response to each pulse 206 provided from the odd number detector 52. The adder 58 produces a result from the increment, i.e. addition, on its output port 214 as a detected phase signal. If the adder 58 has its initial phase set to the value Φ2, for example, then the adder 58 produces a sequence of values Φ2, Φ3 and Φ4 in the order while it receives the pulses 206 twice.

The adder 58 has its output 214 interconnected to the data sampling clock circuit 60, which is adapted to respond to the negative-going transition of the phase detection signal 116 to select one of the sampling clock signals 102-1 through 102-6 which has its phase corresponding to the phase represented by the detected phase signal 214, i.e. one of the phases Φ1 through Φ6. The data sampling clock circuit 60 continues to produce the one clock signal thus selected as the data sampling clock signal 120. The inter-device identification signal 116 is connected to the input of the detection signal generator 62, which is adapted to be responsive to, e.g. the positive-going transition of the phase detection signal 116 to determine the inter-device identification received to output the inter-device identification detection signal 118.

Well, returning to FIG. 1, the gate circuit 26 is configured to respond to the data sampling clock signal 120 to sample the demodulated signal 100 to output a sample on its output port 122 as the taken-in, or sampled, data. The output 122 from the gate circuit 26 is interconnected to the input of the corrector shift register 28. With the illustrative embodiment, the corrector 28 is a 6-bit register which is responsive to the clock signal 130 supplied from the timing control 24 to sequentially, orbit-serially, store the data 122 fed from the gate circuit 26. The shift register 28 develops the six bits of data, when completed therein, on its output 124 as the received data. The reception register 14 shifts the six bits of received data 124 by two bit positions to hold the data thus shifted.

The operation of the clock phase corrector thus structured will be described with reference to FIGS. 5 through 9 when it receives the demodulated signal 100 having the format shown in FIG. 2. The clock phase corrector of the illustrative embodiment detects the inter-device identification signal during the time period T10, FIG. 2, to determine the most appropriate timing at which received data are taken in. FIG. 5 shows the operational timings of the clock phase corrector. In the figure, the line (A) depicts the input demodulated signal 100, and the lines (B) through (G) depict the signals stored in the shift registers 10-1 through 10-6, respectively. On the line (I), a specific inter-device identification "11011101" is shown which is held in the reception register 14. The lines (J) through (N) show the numbers 112 of the inconsistent bits, the phase detection signal 116, the detected phases 214, the phases of the data sampling clock 120 and the data 118, respectively. The notations Φ1, Φ2, Φ3, . . . , Φ6 denote the phases of the sampling clock signals 102-1, 102-2, 102-3, . . . , 102-6, respectively. The marks "X" indicated on the lines (B) through (G) denote such bit positions in the shift registers 10-1, 10-2 through 10-6 which lack the demodulated signal 100.

In the period of time T10, the timing control 24 repetitively provides the shift registers 10-1 through 10-6 with a sequence of sampling clock signals 102-1 through 102-6 in the order. The shift registers 10-1 through 10-6 sample and hold, in response to the respective sampling clock signals 102-1 through 102-6, the demodulated signal 100 with the signals held therein being sequentially shifted toward the output end thereof. Consequently, the shift registers 102-1 through 102-6 are provided with the sampled data of inter-device identification completed during the time period T15, FIG. 5, in which stored are the eighth, ninth and tenth cycles of the sampling clock signals 102-1 through 102-6 counted from the entry of the time period T10. The time period T15 is therefore three times as long as the time period T0.

During the time period T15, the timing control 24 provides the comparator register 12 with the clock signals 104-1 through 104-6. The comparator register 12 responds to the clock signals 104-1 through 104-6, and duplicates the eight bits of demodulated data stored in the shift registers 10-1 through 10-6 in sequence to output the data as the demodulated signal 106 to the one comparator 16. The comparator 16 in turn compares the demodulated signal 106 with the intended inter-device identification data 108 stored in the reception register 14 on a bit-by-bit basis, the identification data 108 including the binary bits "11011101" with the illustrated example. The result 110 from the comparison is output to the bit adder 18. The bit adder 18 counts the number of the inconsistent bits to output the data 112 representing the count to the other comparator 22.

The comparator 22 compares the number of the inconsistent bits 112 with the number of the error acceptance bits 114 to set the phase detection signal 116 to the binary value "1" or "0" accordingly to the result from the comparison. With the example illustrated, the inter-device identification signal includes a small number of bits, and the number of the error acceptance bits 114 is therefore set to "0". Accordingly, when the number of the inconsistent bits is equal to zero, the comparator 22 determines the correct reception of the inter-device identification signal to set the phase detection signal 116 to its binary value "1", whereas when the inconsistent bit number exceeds zero, the comparator 22 determines that the inter-device identification signal has not been received to set the phase detection signal 116 to its binary value "0".

The timing control 24 determines the most appropriate phase for taking in, or sampling, the received data according to the phase detection signal 116. Now referring to FIG. 6 exemplifying the operation of the timing control 24, the line (A) depicts the phase data 210 developed from the phase counter 54. For example, the numerals "5" and "6" represent the phases Φ5 and Φ6, respectively. The line (B) shows the number of the inconsistent bits 112 output from the bit counter 18, FIG. 1, and the line (C) does the phase detection signal 116 received by the timing control 24. The lines (D) through (G) depict the count 204, the detected phase 214, the phase of the data sampling clock signal 120 and the clock signal 202.

The phase detector counter 50 sets its count 204 to zero in response to the binary value "0" of the phase detection signal 116, and increments in response to the clock signal 202 while the phase detection signal 116 takes its binary value "1". The count 204 developed by the phase detection counter 50 therefore varies from "0" through "1" and "2" to "0", as illustrated on the line (D). The odd number detector 52 is adapted to produce, in response to the odd value of the count 204, the pulse 206 having its significant logical state, as stated earlier. The odd number detector 52 therefore outputs the pulse 206 in response to the binary value "1" of the count 204. The initial phase detector 56 takes in the phase data 210 in response to the positive-going transition of the phase detection signal 116, thus the initial phase 212 being the phase Φ2 in the instant example.

The adder 58 in turn sets its counter to the initial value with the phase Φ2 represented by the initial phase signal 212, with this example, and adds to the counter the value corresponding to T0/6 in response to the pulse 206 fed from the odd number detector 52 while being primed with the binary value "1" of the phase detection signal 116. The detected phase 214 thus changes from the phase Φ1 to the phase Φ3, as shown in the line (E).

The data sampling clock circuit 60 takes in the detection phase signal 214 upon the negative-going transition of the phase detection signal 116. Thus, the detected phase signal 214 is taken in, which represents the phase Φ3, with this example. As the data sampling clock signal 120, produced is a sampling clock signal having its phase corresponding to the detected phase 214 thus taken in. The data sampling clock signal 102-3 having its phase Φ3 is produced as the data sampling clock signal 120, as depicted in the line (F). The gate circuit 26 samples and holds the data in response to the data sampling clock signal 120 having its phase Φ3 until the phase is updated in the period of time T13.

Now, in the period of time T13, FIG. 2, the clock phase corrector corrects or adjusts the phase of the data sampling clock signal 120. FIG. 7 is a time chart useful for understanding how the clock phase corrector operates during the period of time T13. In the figure, the lines (A) through (G) and (J) through (N) show, as with FIG. 5, the demodulated signal 100, the signals stored in the shift registers 10-1 through 10-6, the numbers 112 of the inconsistent bits, the phase detection signal 116, the detected phases 214, the phases of the data sampling clock 120 and the data 118, respectively. The lines (H) and (I) depict the data stored in the corrector shift register 28 and in the reception register 14, respectively.

The timing control 24 starts feeding, when it enters the time period T13, the shift registers 10-1 through 10-6 with the sampling clock signals 102-1 through 102-6, respectively, as done in the time period T10. The shift registers 10-1 through 10-6 are responsive to the sampling clock signals 102-1 through 102-6, respectively, to sample and hold the demodulated signal 100 while shifting the stored data toward the respective output ends thereof. The timing control 24 generates the data sampling clock signals 120, and provides them to the corrector shift register 28 as the clock signal 130, which consists of the second through seventh data sampling clock signals 120 counted from the entry of the time period T13.

The corrector shift register 28 responds to the clock signal 130 and stores therein the data 122 output from the gate circuit 26 in sequence. The corrector shift register 28 outputs the six bits of data 122, when completed therein, on its output port 124 to the reception register 14. The reception register 14 shifts the received data 124 by two bit positions and hold the resultant data. For example, when the reception register 14 receives the six bits of data [a0, a1, a2, a3, a4, a5] from the corrector shift register 28, it resultantly holds the shifted data [x, x, a0, a1, a2, a3, a4, a5].

The corrector shift register 28 is fed with the clock signal 130 corresponding to the data sampling clock signal 120. This causes the same data to be provided to the shift register 10-n fed with the sampling clock signal 102-n having its phase Φn, when the data sampling clock signal 120 has its phase Φn, and to the corrector shift register 28, where n takes any of the integers from 1 to 6, inclusive, with the illustrative embodiment. The system may therefore be designed such that the data stored in the shift register 10-n are connected to the input port 124 to the reception register 14 to be transferred to the latter at an appropriate timing and stored in the latter. In that case, the corrector shift register 28 may be omitted.

The timing control 24 provides, when the reception data 124 are stored in the reception register 14, the comparator register 12 with the clock signals 104-1 through 104-6. As exemplified in FIG. 7, during the time period T16, defined from the time when the shift register 10-3 receives the eighth sampling clock signal 102-3, counted from the entry of the time period T13, to the time when the shift register 10-2 receives the tenth sampling clock signal 102-2, the sampling clock signals 102-1 through 102-6 are repetitively supplied to the comparator register 12 as the clock signals 104-1 through 104-6. The time period T13 is therefore twice as long as the time period T0.

Almost in the midway of the time period T16, the shift register 10-3 receives the sampling clock signal 102-3 of the phase Φ3. At that time, the shift register 10-3 has shifted the six bits of data toward its output end and stored the bits at the bit positions nearer the output end. The resultant data will completely be identical with the six bits of received data stored in the corrector register 28. In the period of time T16, the shift registers 10-4, 102-5, 10-6, 10-1, 10-2 and 10-3 respectively receive the sampling clock signals 102-4, 102-5, 102-6, 102-1, 102-2 and 102-3 generated immediately preceding and following the sampling clock 102-3. At that time, the distribution of the consistence ratio, i.e. the time and number of consistent events, of the six bits of data stored in the respective shift registers on the output ends thereof to the six bits of received data stored in the corrector shift register 28 conducts the most appropriate phase of the data sampling clock 120.

The comparator register 12 operates in response to the clock signals 104-1 through 104-6 to duplicate the eight bits of received data stored in the shift registers 10-1 through 10-6, respectively, to output the demodulated signal 106 to the comparator 16. The comparator 16 in turn compares on a bit-by-bit basis the demodulated signal 106 with the six bits of the intended reception data 108 held in the reception register 14 at its bit positions nearer the output end. In the example described above, the reception register 14 contains the data [x, x, a0, a1, a2, a3, a4, a5]. The comparator register 12 develops the demodulated signal 106 [b0, b1, b2, b3, b4, b5, b6, b7], for example. The comparator 16 compares the bits of the received data [a0, a1, a2, a3, a4, a5] with the corresponding bits of the demodulated signal 106 [b2, b3, b4, b5, b6, b7] on a bit-by-bit basis.

The bit adder 18 receives the result 110 from the comparison and counts the inconsistent bit or bits to output the resultant count 112, representing the number of inconsistent bits, to the other comparator 22. The other comparator 22 then compares the number of inconsistent bits 112 with the number of error acceptance bits 114 kept in the error acceptance memory 20, and sets the phase detection signal 116 to the binary value "1" or "0", accordingly to the result from the comparison. The timing control 24 is in response to the phase detection signal 116, and adjusts the phase of the data sampling clock 120 to its most appropriate value.

The operation of the timing control 24 will be described with reference to FIG. 8. In the figure, the lines (A) through (G) depict as in FIG. 6 the phase data 210, the number of the inconsistent bits 112, the phase detection signal 116, the count 204, the detected phase 214, the phase of the data sampling clock signal 120 and the clock signal 202. When the timing control 24 is supplied with the phase detection signal 116, shown in the line (C), the phase detector counter 50 develops the counts 204, "0" "1" "2" "3" and "0", in the order, as shown in the line (D). The odd number detector 52 feeds the adder 58 with the significant pulse 206, if the count 204 is an odd number.

In turn, the initial phase detector 56 responds to the positive-going transition of the phase detection signal 116, and takes in the phase data 210 output from the phase counter 54 to produce the initial phase signal 212, which is the phase Φ3. The adder 58 has now its initial value set to the phase Φ3, and is primed with the binary "1" of the phase detection signal 116 to add the value corresponding to T0/6 in response to the pulse 206 supplied by the odd number detector 52. The detected phase 214 will therefore change from Φ3 to Φ4, as illustrated in the line (E).

The data sampling clock circuit 60 operates in response to the negative-going transition of the phase detection signal 116 to receive the detected phase signal 214 output from the adder 58. With the instant example, the detected phase 214 is Φ4. The data sampling clock circuit 60 will in turn select one 102-4 of the sampling clocks 102-1 through 102-6 which has its phase Φ4. With reference to FIG. 8, when the phase data 210 are Φ3, Φ4 and Φ5, the number of the inconsistent bits 112 shows "0", as shown in the lines (A) and (B). The illustrative embodiment is adapted to select the central state, Φ4, among Φ3, Φ4 and Φ5, as its most appropriate phase. The data sampling clock 120 will accordingly be adjusted in phase from Φ3 to Φ4, as seen in the line (F). From now on, the data sampling clock circuit 60 starts producing the data sampling clock signal 120 of the phase Φ4.

For example, when the timing control 24 receives the phase detection signal 116 shown in the line (C) of FIG. 9 correspondingly to the phase data signal 210 shown in the line (A), the count 204 produced from the phase detector 50 takes the values "0" "1" "2" "3" "4" and "0", as depicted in the line (D), and therefore the odd number detector 52 provides the adder 58 with the significant pulse 206 when the count 204 represents the values "1" and "3". The initial phase detector 56 takes in the phase Φ3 as its initial value to set its counter accordingly. In the adder 58, the binary "1" of the phase detection signal 116 causes the counter included therein to be added by the value corresponding to T0/6 in response to the pulse 206 received. Accordingly, the detected phase 214 will change from Φ3 through Φ4 to Φ5, as shown in the line (E), FIG. 9.

The data sampling clock circuit 60 receives, upon the negative-going transition of the phase detection signal 116, the detected phase signal 214 output from the adder 58 and representing the phase Φ5, in this example. The data sampling clock circuit 60 in turn selects one 102-5 of the sampling clocks 102-1 through 102-6 which has its phase Φ5 to output the latter as the data sampling clock signal 120. This causes, as shown in the line (F), the data sampling clock signal 120 to be corrected in phase from Φ4 to Φ5, as shown in the line (F). As understood from the lines (A) and (B) of FIG. 9, when the number of the inconsistent bits 112 is zero, the phase of the clock signal 102 is Φ3, Φ4, Φ5 or Φ6. The illustrative embodiment is adapted for selecting as the most appropriate phase the phase Φ5, which is almost central in the series of phases.

According to the illustrative embodiment, during the period of sampling the received data, the data sampling clock signal 120 is corrected in phase prior to causing a loss or an error in sampling. It is therefore not necessary to determine with higher resolution the timing of detecting an inter-device identification to define the phase of the data sampling clock signal with minute resolution. That permits the operating frequency for over-sampling an inter-device identification to effectively be reduced to the extent that the circuitry is reduced in size with the operative frequency and power consumption also effectively reduced.

The system may be designed such that the data sampling clock signal 120 may be adjusted more frequently, thus increasing the minimum step of correcting the phases, thus reducing in number the shift registers required for over-sampling. For example, a single correction of the data sampling clock signal permits the registers to be reduced by approximately half in number, and double corrections permit approximately one-third reduction. This can also reduce the operational frequencies with which the circuits included in the clock phase corrector operate.

During the time period in which received data are sampled, the data sampling clock signal 120 is adjusted in sequence so as not to cause a loss or an error in sampling the data. The fluctuation of the duty width of the received data caused by a drift involved in the frequency of reference oscillators in the system would not affect the phase correction of the data sampling clock signal, thus giving rise to improvement in the receiver performance of the system.

It is a tradeoff how many times correction is made on the frequency of over-sampling the demodulated signal 100 and the data sampling clock signal 120. The reduction in frequency of the over-sampling requires an increase of the times of correcting the data sampling clock signal. An increase of the frequency of the over-sampling causes the times of correcting the data sampling clock signal to be reduced. In an application where the reduction in power consumption is not so severe, the over-sampling may be performed during the entire period of time for receiving signals.

In the illustrative embodiment, during the time period T14 in which the data received are over-sampled, the received data are held in the reception register 14 as an intended inter-device identification 108, and the number of the bits of the data thus received is not directly associated with the number of the bits of an inter-device identification. If the system is designed such that the bits of the received data for use in intended reception data 108 are set fewer in number than the bits having successive binary values "0" or "1" in the received data, however, the over-sampling would possibly cause a failure to detect the phase of a clock signal for phase correction without some remedy.

With the illustrative embodiment, the corrector shift register 28 is adapted to store the six bits of received data with two-bit shift made thereon to deliver the eight bits of data to the reception register 14. The corrector register 28 may be so designed as to shift the received data by three or more bit positions. In a system in which the corrector shift register 28 is designed to shift received data by a single bit position, when having started comparing the received data stored in the shift registers 102-1 through 102-6 with intended reception data, the number of inconsistent bits 112 may occasionally be zero. Some care is required against a series of bits having the same binary value "0" or "1".

The entire disclosure of Japanese patent application No. 2004-11477 filed on Jan. 20, 2004, including the specification, claims, accompanying drawings and abstract of the disclosure is incorporated herein by reference in its entirety.

While the present invention has been described with reference to the particular illustrative embodiment, it is not to be restricted by the embodiment. It is to be appreciated that those skilled in the art can change or modify the embodiment without departing from the scope and spirit of the present invention.

What I claim is:

1. A clock phase corrector for use in a receiver receiving a transmitted signal having a predetermined transmission rate for correcting a phase of a data sampling clock signal, comprising:
    a timing control circuit for generating a plurality of sampling clock signals, and selecting one of the sampling clock signals as the data sampling clock signal, the plurality of sampling clock signals having a period corresponding to the transmission rate and a phase different from each other;
    an over-sampling circuit operative in response to the plurality of sampling clock signals for sampling the received signal, said over-sampling circuit comprising a plurality of shift registers, each of which corresponds to one of the plurality of sampling clock signals and stores a signal sampled in response to the one sampling clock signal;
    a gate circuit operative in response to the data sampling clock signal for sampling the received signal to output data resultant from sampling;
    a storage circuit for storing the data output from said gate circuit;
    a calculator for comparing the stored data with the sampled signals respectively stored in the plurality of shift registers to determine a number of inconsistent bits between the stored data and the sampled signals; and
    a comparator for comparing the number of inconsistent bits with a predetermined error acceptance number, and determining a period of time in which the number of inconsistent bits is smaller than the predetermined error acceptance number;
    said timing control circuit determining a center of the period of time, and selecting one of the plurality of sampling clock signals which corresponds to the center as the data sampling clock signal.

2. The clock phase corrector in accordance with claim 1, wherein said timing control circuit provides the plurality of shift registers correspondingly with the plurality of sampling clock signals to cause said storage circuit to be fed with the sampled signal stored in one of the plurality of shift registers which is supplied with the one sampling clock signal selected.

3. The clock phase corrector in accordance with claim 1, wherein said timing control circuit supplies said over-sampling circuit with the plurality of sampling clock signals at least once during a period of time in which the received signal carries the data.

4. The clock phase corrector in accordance with claim 2, wherein said timing control circuit supplies said over-sampling circuit with the plurality of sampling clock signals at least once during a period of time in which the received signal carries the data.

5. The clock phase corrector in accordance with claim 1, wherein said timing control circuit determines a difference of the data sampling clock signal from a clock signal corresponding to the transmission rate, and generates the plurality of sampling clock signals when the difference exceeds a predetermined threshold.

6. The clock phase corrector in accordance with claim 2, wherein said timing control circuit determines a difference of the data sampling clock signal from a clock signal corresponding to the transmission rate, and generates the plurality of sampling clock signals when the difference exceeds a predetermined threshold.

7. The clock phase corrector in accordance with claim 1, wherein, during a period of time in which the received signal carries an inter-device identification, said storage circuit stores a predetermined inter-device identification, and said timing control circuit generates and outputs the plurality of sampling clock signals.

8. The clock phase corrector in accordance with claim 2, wherein, during a period of time in which the received signal carries an inter-device identification, said storage circuit stores a predetermined inter-device identification, and said timing control circuit generates and outputs the plurality of sampling clock signals.

9. The clock phase corrector in accordance with claim 7, wherein the inter-device identification includes a synchronous pattern signal.

10. The clock phase corrector in accordance with claim 8, wherein the inter-device identification includes a synchronous pattern signal.

* * * * *